United States Patent [19]

Soukiassian et al.

[11] Patent Number: 4,900,710
[45] Date of Patent: Feb. 13, 1990

[54] PROCESS OF DEPOSITING AN ALKALI METAL LAYER ONTO THE SURFACE OF AN OXIDE SUPERCONDUCTOR

[75] Inventors: Patrick Soukiassian, Bures-sur-Yvette, France; Robert V. Kasowski, West Chester, Pa.

[73] Assignee: E. I. DuPont De Nemours and Company, Wilmington, Del.

[21] Appl. No.: 266,553

[22] Filed: Nov. 3, 1988

[51] Int. Cl.$^4$ .............................................. B05D 5/12
[52] U.S. Cl. ........................................ 505/1; 427/62; 427/63; 427/124; 427/250
[58] Field of Search ............... 427/62, 63; 505/1, 818, 505/819

[56] References Cited

PUBLICATIONS

Wu et al., "The Effects of Alkali Impurities on the Superconductivity and Powder Characteristics of $YBa_2Cu_3O_7$" Mater. Lett. (Apr. 1988), vol. 6(7) pp. 211-216.
Bednorz et al., Z. Phys. B64, 189 (1986).
Rao et al., Current Science 56, 47 (1987).
Chu et al., Science 235, 567 (1987).
Chu et al., Phys. Rev. Lett. 58,405 (1987).
Cava et al., Phys. Rev. Lett. 58,408 (1987).
Bednorz et al., Europhys. Lett. 3,379 (1987).
Wu et al., Phys. Rev. Lett. 58,908 (1987).
Cava et al., Phys. Rev. Lett. 58,1676 (1987).
Michel et al., Z. Phys. B-Condensed Matter 68,421 (1987).
Maeda et al., Jpn. J. Appl. Phys. 27, L209 (1988).
Subramanian et al., Science 239, 1015 (1988).
Sheng et al., Nature 332, 55 (1988).
Sheng et al., Nature 332, 138 (1988).
Hazen et al., Phys. Rev. Lett. 60, 1657 (1988).
Torardi et al., Science 240, 631 (1988).
Parkin et al., Phys. Rev. Lett. 61, 750 (1988).
Hervieu et al., J. Solid State Chem. 75, 212 (1988).
Torardi et al., Phys. Rev. B38, 225 (1988).
Liang et al., Appl. Phys. Lett. 53, 1434 (1988).

*Primary Examiner*—Norman Morgenstern
*Assistant Examiner*—Roy V. King

[57] ABSTRACT

This invention relates to a process for improving the properties of metal oxide superconductors said process comprising deposition an alkali metal layer having a thickness of less than about three monolayers onto the surface of an oxide superconductor by evaporation.

3 Claims, No Drawings

PROCESS OF DEPOSITING AN ALKALI METAL LAYER ONTO THE SURFACE OF AN OXIDE SUPERCONDUCTOR

BACKGROUND OF THE INVENTION

1. Field of the Invention

This invention relates to a process for improving the properties of metal oxide superconductors said process comprising depositing an alkali metal onto the surface.

2. References

Bednorz and Muller, Z. Phys. B64, 189 (1986), disclose a superconducting phase in the La-Ba-Cu-O system with a superconducting transition temperature of about 35 K. This disclosure was subsequently confirmed by a number of investigators [see, for example, Rao and Ganguly, Current Science, 56, 47 (1987), Chu et al., Science 235, 567 (1987), Chu et al., Phys. Rev. Lett. 58, 405 (1987), Cava et al., Phys. Rev. Lett. 58, 408 (1987), Bednorz et al., Europhys. Lett. 3, 379 (1987)]. The superconducting phase has been identified as the composition $La_{1-x}(Ba,Sr,Ca)_xCuO_{4-y}$ with the tetragonal $K_2NiF_4$-type structure and with x typically about 0.15 and y indicating oxygen vacancies.

Wu et al., Phys. Rev. Lett. 58, 908 (1987), disclose a superconducting phase in the Y-Ba-Cu-O system with a superconducting transition temperature of about 90 K. Cava et al., Phys. Rev. Lett. 58, 1676 (1987), have identified this superconducting Y-Ba-Cu-O phase to be orthorhombic, distorted, oxygen-deficient perovskite $YBa_2Cu_3O_{9-\delta}$ where $\delta$ is about 2.1 and present the powder x-ray diffraction pattern and lattice parameters.

C. Michel et al., Z. Phys. B-Condensed Matter 68, 421 (1987), disclose a novel family of superconducting oxides in the Bi-Sr-Cu-O system with composition close to $Bi_2Sr_2Cu_2O_{7+\delta}$. A pure phase was isolated for the composition $Bi_2Sr_2Cu_2O_{7+\delta}$. The X-ray diffraction pattern for this material exhibits some similarity with that of perovskite and the electron diffraction pattern shows the perovskite subcell with the orthorhombic cell parameters of a=5.32 A (0.532 nm), b=26.6 A (2.66 nm) and c=48.8 A (4.88 nm). The material made from ultrapure oxides has a superconducting transition with a midpoint of 22 K as determined from resistivity measurements and zero resistance below 14 K. The material made from commercial grade oxides has a superconducting transition with a midpoint of 7 K.

H. Maeda et al., Jpn. J. Appl. Phys. 27, L209 (1988), disclose a superconducting oxide in the Bi-Sr-Ca-Cu-O system with the composition near $BiSrCaCu_2O_x$ and a superconducting transition temperature of about 105 K.

The commonly assigned application, "Superconducting Metal Oxide Compositions and Process For Making Them", Ser. No. 153,107, filed Feb. 8, 1988, a continuation-in-part of Ser. No. 152,186, filed Feb. 4, 1988, now abandoned, disclose superconducting compositions having the nominal formula $Bi_aSr_bCa_cCu_3O_x$ wherein a is from about 1 to about 3, b is from about $\frac{2}{3}$ to about 4, c is from about 3/16 to about 2 and x=(1.5 a+b+c+y) where y is from about 2 to about 5, with the proviso that b+c is from about 3/2 to about 5, said compositions having superconducting transition temperatures of about 70 K or higher. It also discloses the superconducting metal oxide phase having the formula $Bi_2Sr_{3-z}Ca_zCu_2O_{8+w}$ wherein z is from about 0.1 to about 0.9, preferably 0.4 to 0.8 and w is greater than zero but less than about 1. M. A. Subramanian et al., Science 239, 1015 (1988) also disclose the $Bi_2Sr_{3-z}Ca_zCu_2O_{8+w}$ superconductor.

Z. Z. Sheng et al., Nature 332, 55 (1988) disclose superconductivity in the Tl-Ba-Cu-O system in samples which have nominal compositions $Tl_2Ba_2Cu_3O_{8+x}$ and $TlBaCu_3O_{5.5+x}$. Both samples are reported to have onset temperatures above 90 K and zero resistance at 81 K. The samples were prepared by mixing and grinding appropriate amounts of $BaCO_3$ and CuO with an agate mortar and pestle. This mixture was heated in air at 925° C. for more than 24 hours with several intermediate grindings to obtain a uniform black oxide Ba-Cu oxide powder which was mixed with an appropriate amount of $Tl_2O_3$, completely ground and pressed into a pellet with a diameter of 7 mm and a thickness of 1–2 mm. The pellet was then put into a tube furnace which had been heated to 880°–910° C. and was heated for 2–5 minutes in flowing oxygen. As soon as it had slightly melted, the sample was taken from the furnace and quenched in air to room temperature. It was noted by visual inspection that $Tl_2O_3$ had partially volatilized as black smoke, part had become a light yellow liquid, and part had reacted with Ba-Cu oxide forming a black, partially melted, porous material.

Z. Z. Sheng et al., Nature 332, 138 (1988) disclose superconductivity in the Tl-Ca-Ba-Cu-O system in samples which have nominal compositions $Tl_2Ca_2Ba Cu_3O_{9+x}$ with onset of superconductivity at 120 K.

R. M. Hazen et al., Phys. Rev. Lett. 60, 1657 (1988), disclose two superconducting phases in the Tl-Ba-Ca-Cu-O system, $Tl_2Ba_2Ca_2Cu_3O_{10}$ and $Tl_2Ba_2CaCu_2O_8$, both with onset of superconductivity near 120 K. C. C. Torardi et al., Science 240, 631 (1988) disclose the preparation of $Tl_2Ba_2Ca_2Cu_3O_{10}$ with an onset of superconductivity of 125 K.

S. S. P. Parkin et al., Phys. Rev. Lett. 61, 750 (1988), disclose the structure $TlBa_2Ca_2Cu_3O_{9\pm y}$ with transition temperatures up to 110 K.

M. Hervieu et al., J. Solid State Chem. 5, 212 (1988), disclose the oxide $TlBa_2Ca_2Cu_3O_{8-y}$.

C. C. Torardi et al., Phys. Rev. B 38, 225 (1988), disclose the oxide $Tl_2Ba_2CuO_6$ with an onset of superconductivity at about 90 K.

The commonly assigned application, "Superconducting Metal Oxide Compositions and Processes For Manufacture and Use", Ser. No. 236,088, filed Aug. 24, 1988, a continuation-in-part of Ser. No. 230,631, filed Aug. 10, 1988, now abandoned, disclose superconducting compositions having the nominal formula $Tl_ePb_aCa_bSr_cCu_dO_x$ wherein a is from about 1/10 to about 3/2, b is from about 1 to about 4, c is from about 1 to about 3, d is from about 1 to about 5, e is from about 3/10 to about 1 and x=(a+b+c+d+e+y) where y is from about ½ to about 3. These compositions have an onset of superconductivity of at least 70 K.

J. M. Liang et al., Appl. Phys. Lett. 53, 15 (1988) disclose a composition $TlBa_2Ca_3Cu_4O_x$ with an onset of superconductivity at 155 K and a zero resistance at 123 K. $CaCO_3$, $BaCO_3$ and CuO powders were ground together and calcined for 15 hours with intermediate grindings. The Ba-Ca-Cu-O powders were mixed with $Tl_2O_3$ to yield a mixture with nominal composition $TlBaCa_3Cu_3O_x$. This mixture was ground, pressed and sintered for 15 minutes in flowing $O_2$. Composition ratios of the Tl:Ca:Ba:Cu in the superconductor vary from 1:2:2:3 to 1:2:3:4.

SUMMARY OF THE INVENTION

This invention provides a process for improving the properties of shaped polycrystalline high temperature metal oxide superconductors, said shaped superconductors containing Copper, said shaped superconductors having at least one dimension less than about 1 mm, preferably less than about 0.1 mm, said process comprising (a) depositing an alkali metal onto a clean surface of said shaped superconductor by evaporation from an alkali metal source with the pressure maintained sufficiently low so as to avoid contamination of said surface by any species other than oxygen and said shaped superconductor maintained at a temperature of from about 0° C. to about 400° C. during the deposition, said alkali metal deposit having a thickness of less than about three monolayers, (b) exposing the superconductor with the deposited alkali metal layer to oxygen at a temperature of from about 0° C. to about 400° C., said exposure at least about 10,000 langmuir ($1.33 \times 10^{-4}$ Pa-sec), (c) and thereby producing an improved superconductor.

It is preferred that during the deposition of the alkali metal, the pressure be maintained below $10^{-8}$ torr ($1.33 \times 10^{-6}$ Pa), more preferably below $10^{-10}$ torr ($1.33 \times 10^{-8}$ Pa) and most preferably below $5 \times 10^{-11}$ torr ($6.67 \times 10^{-9}$ Pa).

DETAILED DESCRIPTION OF THE INVENTION

This invention provides a process for improving the properties of the high temperature metal oxide superconductors containing copper. In particular the properties of polycrystalline shaped superconductor articles can be improved. The resulting improvement enables one to direct more current through a superconductor without losing the superconductivity effect. Such an improvement would be helpful in producing larger magnetic fields in a coil made of the superconductive material for use in MRI for instance, or levitation. Shaped superconductors having been subjected to the process of the invention are found to have higher critical current densities, higher superconducting transition temperatures and/or sharper superconductor transitions, i.e. the transition occurs over a narrower temperature range, than the sample had before undergoing the process.

The shaped polycrystalline superconductors can be any of the high temperature superconductors containing copper. For instance, $RBa_2Cu_3O_{7-x}$ where R is at least one element selected from the group consisting of Y, La, Nd, Sm, Eu, Gd, Dy, Ho, Er, Tm, Yb and Lu is preferred. These shaped polycrystalline superconductors can be in any form, for example, films, fibers, discs, bars, etc., with the provision that the shaped superconductor has at least one dimension less than about 1 mm, preferably less than about 0.1 mm. These shaped polycrystalline superconductors can be formed by sintering pressed superconductor powder or the pressed powder of the superconductor precursor, by sputtering, by spinning or by any of the various methods known in the art for making such shaped articles.

In more detail, the first step of the process of the invention is comprised of depositing alkali metal onto a clean surface of the shaped superconductor. A clean surface is one with no significant contamination by species other than oxygen. A clean surface, as known by one skilled in the art, can be achieved by $Ar^+$ ion bombardment for period of a few minutes. Alternatively, superconductor samples that cleave readily can be cleaved and the cleaved surface used as the clean surface. If $Ar^+$ results in the depletion of oxygen at the surface of the sample, oxygen can be restored by annealing the sample at 350°–370° C. in an oxygen atmosphere of $6-8 \times 10^{-4}$ torr ($8-11 \times 10^{31\ 2}$ Pa) for 30 minutes.

Evaporation of the alkali metal must be carried out in an atmosphere and at a pressure which avoids contamination of the clean surface of the superconductor by any species other than oxygen. Preferred are pressures below $10^{-8}$ torr ($1.33 \times 10^{-6}$ Pa), more preferably below $10^{-8}$ torr ($1.33 \times 10^{-8}$ Pa) and most preferably below $5 \times 10^{-11}$ torr ($6.67 \times 10^{-9}$ Pa). The higher pressures may be sufficient when a predominantly oxygen atmosphere is used.

The thickness of the alkali metal deposit is typically of the order of a monolayer. The thickness should be less than three monolayers. Deposition is carried out at a temperature from about 0° C. to about 400° C.

Following deposition of the alkali metal, the superconductor is exposed to oxygen with the temperature at about 0° C. to about 400° C. with an exposure of at least about 10,000 langmuir ($1.33 \times 10^{-4}$ Pa-sec). Preferred alkali metals are Rb and Cs.

The shaped superconductors that have undergone the process of the invention are found to have higher critical current densities, higher superconducting transition temperatures and/or sharper superconductor transitions, i.e. the transition occurs over a narrower temperature range, than the sample had before undergoing the process. These improved processes appear to be correlated with oxygen uptake by the superconductor. Photoemission results clearly indicate an oxygen uptake upon exposure to oxygen after deposition of the alkali metal and this uptake results in higher oxygen content in the treated sample in contrast to an untreated one. The alkali metal appears to both increase the rate of oxygen uptake by the superconductor and to serve maintain a higher oxygen level.

EXAMPLE

A film of $YBa_2Cu_3O_{7-x}$ was grown in a rf planar magnetron sputtering system using the following procedure. The chamber was pumped to a base pressure of about $10^{-7}$ torr ($1.33 \times 10^{-5}$ Pa). The target was fabricated by mixing stoichiometric amounts of $BaO_2$, $Y_2\alpha 3$, and CuO powders and firing the mixture at 1000° C. for 3 hours in air. The resulting mixture was then re-crushed in a ball mill and pressed in a 18000 psi ($1.2 \times 10^{12}$ Pa) press into a disc 10 cm in diameter and 0.6 cm thick. This disk was then subjected to a final firing at 1000° C. for 16 hours. The resulting target was black with a room temperature resistance of 5 ohms and a zero resistance temperature $T_0 = 92$ K. After insertion into the vacuum chamber, the target was sputter-etched for 4 hours prior to initiating film deposition. Sputtering was carried out at room temperature in an ultrahigh pure $Ar + 10\%$ $O_2$ atmosphere with total sputtering pressure ranging from 3 to 5 mtorr (0.4 to 0.7 Pa). The target power density was 2 to 5 watts/cm$^2$ with a substrate to target separation of 4 cm. A film 1.0 μm thick was deposited on a (100) face of a single crystal of MgO. The deposition rate was about 100 A/min (0.01 μm/min).

Resistance measurements were made by the four-point probe technique. Indium current and voltage contacts were ultrasonically bonded to the film and 60 μm Cu wires were soldered to these indium contacts. Samples were mounted in a Janis helium cryostat which was placed. The current density for the resistance as a function of temperature measurements were 30 mA/cm$^2$. Data were collected while the temperature was allowed to change at approximately 1-2 K/minute resulting in an error of less than 0.1 K.

The as-grown film was amorphous and was subsequently annealed in flowing oxygen at 850° C. for 15 minutes and was allowed to furnace cool.

The critcal current density (current density at which the material ceases to exhibit superconductivity) at 4.2 K was 50,000 A/cm$^2$. The onset of superconductivity was observed at 78 K.

This YBa$_2$Cu$_3$O$_{7-x}$ thin film was placed in a vacuum chamber for deposition of the alkali metal. The pressure was maintained below $5 \times 10^{-11}$ torr ($6.67 \times 10^{-9}$ Pa). The sample was subjected to an Ar$^+$ ion bombardment for a period of about 4 minutes to clean the surface. Oxygen was restored to the surface by annealing the film at about 360° C. in an oxygen atmosphere of $6-8 \times 10^{-4}$ torr ($8-11 \times 10^{-2}$ Pa) for 30 minutes.

The alkali metal Rb was then deposited onto the clean surface of the superconductor, i.e., the surface that had been bombarded with Ar$^+$, at room temperature, about 20° C., using a carefully outgassed alkali chromate source. The distance from the source to the superconductor sample was about 3 cm. The current through the source was 5.3 A and the evaporation continued for 220 seconds. The pressure increase during evaporation was less than $2 \times 10^{-11}$ torr. Approximately one monolayer of Rb was deposited.

The sample was then exposed to 24000 langmuir of oxygen. The sample was maintained in the vacuum for 36 hours. Oxygen was introduced in the chamber until the pressure reached 1 torr and then air was introduced to bring the pressure up to atmospheric pressure.

The critcal current density at 4.2 K was 100,000 A/cm$^2$. The onset of superconductivity was observed at about 90 K.

We claim:

1. A process for improving the properties of a shaped polycrystalline high temperature copper oxide superconductor, said shaped superconductor having at least one dimension less than about 1 mm, said process comprising;
   (a) depositing an alkali metal onto a clean surface of said shaped superconductor, which clean surface is free from contamination by species other than oxygen, by evaporation from an alkali metal source at a pressure below about $10^{-8}$ torr ($1.33 \times 10^{-6}$ pa), said shaped superconductor maintained at a temperature of from about 0° C. to about 400° C. during the deposition, to produce an alkali metal layer having a thickness of less than about three monolayers,
   (b) exposing the superconductor with the deposited alkali metal layer to oxygen at a temperature of from about 0° C. to about 400° C., and at an exposure of at least about 10,000 langmuir ($1.33 \times 10^{-4}$ pa-sec), to thereby produce an improved superconductor.

2. The process of claim 1 wherein the alkali metal is selected from Rb or Cs.

3. The process of claim 2 wherein during the deposition of the alkali metal the pressure is maintained below $5 \times 10^{-11}$ torr ($6.67 \times 10^{-9}$ Pa).

* * * * *